(12) United States Patent
Jones

(10) Patent No.: US 6,204,685 B1
(45) Date of Patent: Mar. 20, 2001

(54) DUAL-FUNCTION METHOD AND CIRCUIT FOR PROGRAMMABLE DEVICE

(75) Inventor: Christopher W. Jones, Pleasanton, CA (US)

(73) Assignee: Cypress Semiconductor Corp., San Jose, CA (US)

(*) Notice: Subject to any disclaimer, the term of this patent is extended or adjusted under 35 U.S.C. 154(b) by 0 days.

(21) Appl. No.: 09/370,669

(22) Filed: Aug. 9, 1999

(51) Int. Cl.$^7$ ................................................. H03K 17/177
(52) U.S. Cl. ................................................ 326/38; 326/40
(58) Field of Search .................................. 326/37–41

(56) References Cited

U.S. PATENT DOCUMENTS

| | | | |
|---|---|---|---|
| 5,220,214 | * 6/1993 | Pedersen | 326/41 |
| 5,350,954 | * 9/1994 | Patel | 326/41 |
| 5,414,376 | * 5/1995 | Hawes | 326/40 |
| 5,523,706 | * 6/1996 | Kiani et al. | 326/41 |

OTHER PUBLICATIONS

1000 Family Architectural Description—Generic Logic Block, 1994 Data Book, pp. 2–12 to 2–14.
1000 Family Architectural Description—Timing Model, 1994 Data Book, pp. 2–21.
2000 Family Architectural Description, 1994 Data Book, pp. 2–26.
3000 Family Architectural Description—Generic Logic Block, 1994 Data Book, pp. 2–32.

\* cited by examiner

*Primary Examiner*—Michael Tokar
*Assistant Examiner*—Don Phu Le
(74) *Attorney, Agent, or Firm*—Christopher P. Maiorana, P.C.

(57) ABSTRACT

A logic block in a product-term based programmable device comprising a first logic gate, a second logic gate, a macrocell and a multiplexer. The first logic gate may be configured to generate a first output in response to a logical combination of a first number of product terms. The second logic gate may be configured to generate a second output in response to a logical combination of a second number of product terms. The macrocell may be configured to generate a third output in response to the second output. The multiplexer may be configured to select an output of the device in response to (i) the first output or (ii) the third output. The first number of product terms may be a subset of the second number of product terms.

11 Claims, 3 Drawing Sheets

NOTE: ◯ DENOTES ONE FUSE PER PAIR OF PRODUCT TERMS
X DENOTES A SINGLE FUSE PER PRODUCT TERM

US 6,204,685 B1

DUAL-FUNCTION METHOD AND CIRCUIT FOR PROGRAMMABLE DEVICE

FIELD OF THE INVENTION

The present invention relates to a method of implementing a fast path with a dual-function macrocell in a product-term based programmable device generally and, more particularly, to a complex programmable logic device (CPLD) architecture.

BACKGROUND OF THE INVENTION

In one previous architecture, fast paths in a Generic Logic Block (GLB) in a product term based CPLD were identified by the term "PT Bypass" (see the 1000, 2000, and 3000 families of CPLDs available commercially from Lattice Semiconductor Corporation, Hillsboro, Oregon). The same scheme was used in all three families, and is shown in their 1994 data book (pp. 2-12, 2-13, 2-14, 2-21, 2-26, and 2-32).

The figure on page 2-12 of the data book shows the number and allocation of product terms in the GLB. The figures on page 2-13 show how the fast path is implemented and how the XOR gate can be used. The figure on page 2-14 provides an example of another configuration of the GLB where the second of the four macrocells uses a fast path. A timing model is shown on page 2-21 of the data book indicating that the "4 PT Bypass" is the fastest path through a portion of the GLB. The figures on page 2-26 and page 2-32 indicate that the same scheme has been propagated to the 2000 and 3000 family architectures.

The disadvantage of the Lattice method is that when the "4 PT Bypass" is used, the capability that was previously available for that macrocell is completely lost. The previous capability includes an XOR gate or an OR gate with up to 20 PTs.

SUMMARY OF THE INVENTION

The present invention concerns a logic block in a product-term based programmable device comprising a first logic gate, a second logic gate, a macrocell and a multiplexer. The first logic gate may be configured to generate a first output in response to a logical combination of a first number of product terms. The second logic gate may be configured to generate a second output in response to a logical combination of a second number of product terms. The macrocell may be configured to generate a third output in response to the second output. The multiplexer may be configured to select an output of the device in response to (i) the first output or (ii) the third output. The first number of product terms may be a subset of the second number of product terms.

The objects, features and advantages of the present invention include implementing a programmable device that may (i) provide a faster path through a programmable logic block architecture, (ii) implement dual functionality, such as a fast combinatorial path and a buried macrocell, and/or (iii) implement a superset capability to previous commercial architectures.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention provides a method of implementing a fast path with a dual-function macrocell in a product term based programmable device. The present invention may have a particular advantage in a CPLD architecture. The fast path may provide both (a) higher combinatorial performance and/or capability and (b) buried macrocell operation. The present invention may also provide backward compatibility with one or more single function macrocell programmable device architectures.

In the present application, a "programmable device" refers to any semiconductor-containing device or integrated circuit that contains circuitry adapted to carry out a logic operation in response to (i) configurable inputs and/or (ii) configurable routing of input signals and/or output signals therefrom, particularly in response to (1) user-configurable bits stored in a memory, and (2) user-configurable routing of input signals to the circuit. Consequently, "programmable devices" include programmable logic devices, complex programmable logic devices, field programmable gate arrays, user-configurable (micro)processors (such as digital signal processors) and (micro)controllers.

Figure 1:
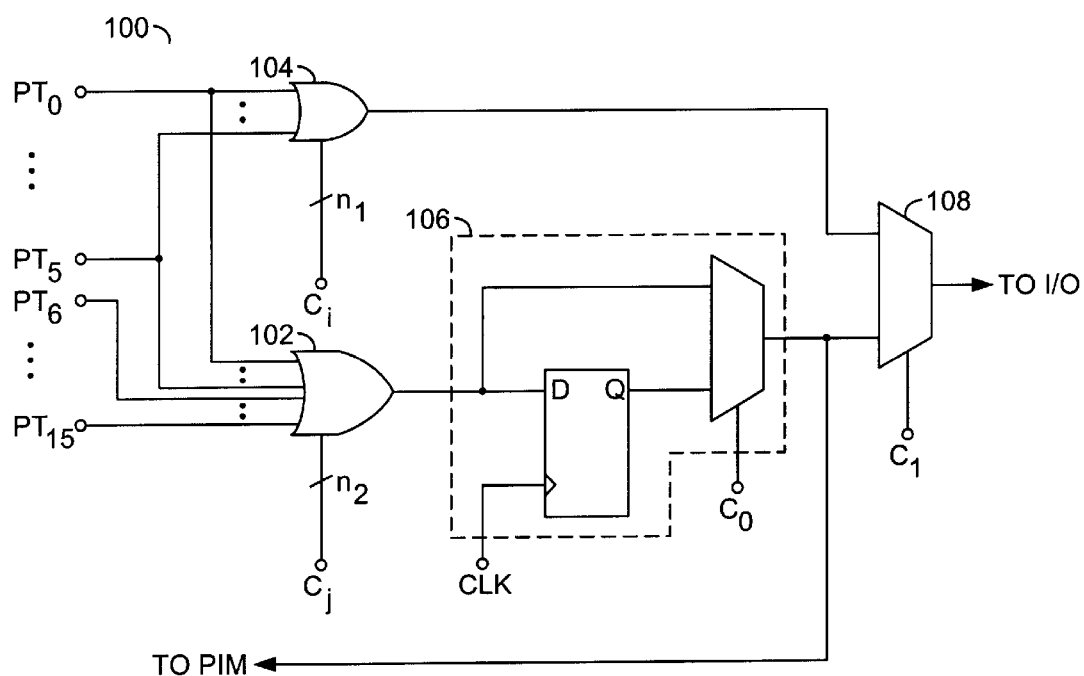
FIG. 1 is a diagram illustrating a preferred embodiment of the present invention.

Referring to FIG. 1, a circuit 100 illustrating one embodiment of the present invention is shown. In the example of FIG. 1, sixteen product terms (e.g., $PT_0$–$PT_{15}$) are shown. The product terms $PT_0$–$PT_{15}$ are available and/or routable to a bottom (or last) logic gate 102. A subset (e.g., six) of the product terms $PT_0$–$PT_{15}$ are additionally made available to a top (or upper) logic gate 104. The logic gates 102 and 104 may be implemented, in one example, as OR gates. In the present invention, an "OR gate" refers to any combination of transistors or logic gates that provide an OR operation, such as an OR gate, a NOR gate followed by an inverter, etc. The output of the logic gate 104 may be multiplexed to an output or input/output (I/O) pin dedicated to a macrocell 106, through a multiplexer 108. In a preferred embodiment, selection of the output I/O through the multiplexer 108 is generally controlled by a user-configurable memory location (e.g., a signal C1).

A fast path is generally provided when the output of the logic gate 104 is selected (e.g., the signal C1 is set to select the output of the logic gate 104 for the output I/O). When the signal C1 is set in this fashion, the logic gate 102 can still use a subset of unique product terms $PT_0$–$PT_{15}$ (e.g., at least one-fourth, preferably at least half, more preferably at least 60%, and in the example shown in FIG. 1, 10 out of 16). All of the available and/or routable product terms (e.g., 16 total) may be used for logic implemented as a buried macrocell function. The buried macrocell function can be either registered or combinatorial. Thus, the present invention may be termed "dual-function" since the fast path and the buried macrocell can both be used at the same time with different logic equation inputs. The circuit 100 may provide a predetermined number of product terms $PT_0$–$PT_{15}$ into two (or more) logic gates providing the dual (or more) functions. The circuit 100 may select a predetermined number of such product terms $PT_0$–$PT_{15}$ (e.g., in accordance with criteria described below).

The multiplexer 108 may further include polarity selection. For example, a third and fourth input may be provided to the multiplexer 108, respectively branching from the output of the logic gate 104 and the output of the macrocell 106. The third and fourth outputs may be inverted before the multiplexer 108 can select the output I/O. An example of such polarity selection may be found in co-pending application Serial No. 09/046,960, which is hereby incorporated by reference in its entirety. The present dual-function circuit 100 may be advantageously located in a logic block or an input/output cell of a programmable device, preferably in a logic block of a CPLD.

For backward compatibility to single function fast path architectures (e.g., combinatorial or [buried] register), a user-configurable memory bit (e.g., the signal Cl) may be programmed to select the output of the macrocell 106 for the output I/O. In such an example, the output of the logic gate 104 is not used. A number of bits (e.g., Cj) may control the logic gate 102. The bits Cj are user-configurable memory locations that may control which product terms $PT_0$–$PT_{15}$ are included and which product terms $PT_0$–$PT_{15}$ are excluded in the logic function of the logic gate 102. Similarly, a number of bits (e.g., Ci) may control the product terms $PT_0$–$PT_{15}$ available for the logic gate 104. In the absence of bits Ci controlling the logic gate 104, the fast path eliminates one gate delay and goes even faster (e.g., about 100 ps for a gate fabricated using 0.5 $\mu$m wide technology).

Figure 2:
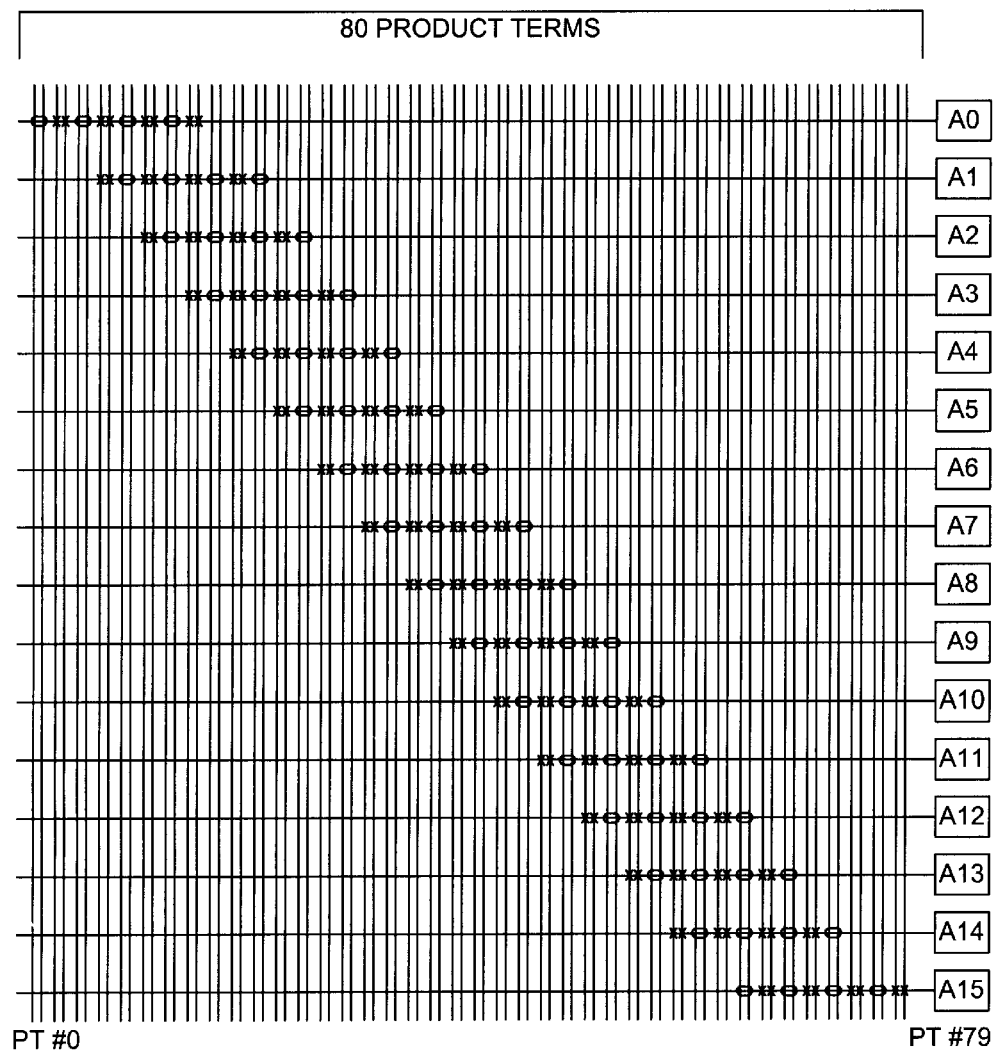
FIG. 2 is a diagram illustrating an example of allocation of a number of product terms.
Figure 3:
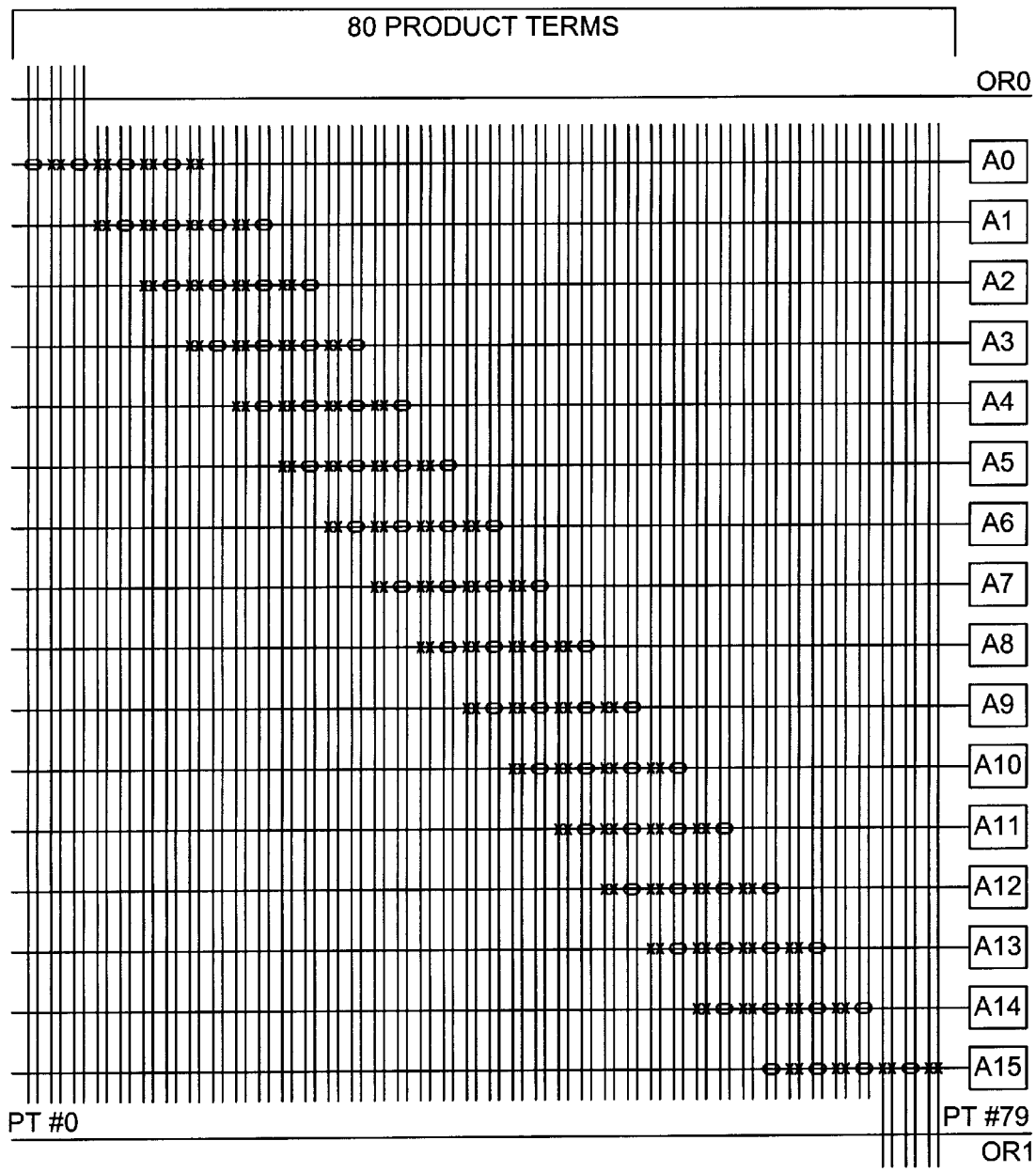
FIG. 3 is a diagram illustrating a subset of product terms allocated to a logic gate.

Referring to FIGS. 2 and 3, examples illustrating the present invention implemented within a product term allocator for a CPLD logic block in commercially available CPLD families are shown. FIG. 2 shows an example of the allocation of 80 general product terms (e.g., $PT_0$–$PT_{79}$). Each macrocell can be allocated to a maximum percentage (in this case, 16 product terms or 20%) of the general product terms $PT_0$–$PT_{79}$. The maximum fanout of a single one of the product terms $PT_0$–$PT_{79}$ may be predetermined (in this case, four macrocells or 25%). However, the maximum percentage of the general product terms $PT_0$–$PT_{79}$ to which each macrocell can be allocated, and the maximum fanout of a single one of the product terms $PT_0$–$PT_{79}$ may vary according to design, but will typically be from $[(n/m) \times 100\%]$ to $[([m-n]/m) \times 100\%]$, where m is the number of general product terms $PT_0$–$PT_{79}$, and n is an integer of at least 2, preferably at least 3, and more preferably at least four.

FIG. 3 illustrates a subset (e.g., six) of product terms $PT_0$–$PT_{79}$ on each end allocated to, for example, the logic gate 104 of FIG. 1. The two subsets may be selected on the basis of their fanout in a corresponding previous architecture, which may be single function. The selection may provide a minimum number of macrocells, preferably only one macrocell, allowing the selected product terms (e.g., the product terms $PT_0$–$PT_5$ and $PT_{74}$–$PT_{79}$) to operate faster than any of the remaining product terms $PT_0$–$PT_{79}$ that may be provided as inputs to more than the minimum number of macrocells.

For implementation within a logic block in an existing commercially available CPLD, the logic gate OR0 is generally multiplexed into a dedicated input or I/O cell of a first macrocell (i.e., AO), and the logic gate OR1 is generally multiplexed into a dedicated input or I/O cell of a second macrocell (i.e., A14). For some device/package combinations, the last macrocell (i.e., A15) may be a buried macrocell. With a buried macrocell, the logic gate OR1 may not be multiplexed into the input or dedicated I/O cell of the macrocell A15.

The present dual-function fast path provides a faster path through the present logic block architecture than previous architectures where the OR gate in the path (a) accepts product terms that have greater fanout and (b) has a greater fan-in (e.g., most or all of the available product terms). In the present invention, the product terms associated with a fast path are faster than the majority of the remaining product terms(s) because of a smaller fanout. Additionally, if the control bits to the logic gate are eliminated, additional speed may be gained.

The present invention may be implemented as a superset of logic blocks in commercially available devices, allowing one to provide the same functionality that may have been previously offered. Thus, the present invention may be used to replace previous devices.

Compared to the previous fast path solutions, the present invention provides a fast path while still allowing the macrocell to be used in a buried register or buried combinatorial capacity. At least a minimum number of unique product terms (e.g., at least half, and in the examples illustrated, 10 out of 16) and as many as all of the product terms may be routable to the macrocell (16 total in the examples illustrated). The present invention may provide the ability to steer some of the available product terms to an additional logic gate for the purpose of providing a fast, combinatorial path without losing the buried capabilities.

While the invention has been particularly shown and described with reference to the preferred embodiments thereof, it will be understood by those skilled in the art that various changes in form and details may be made without departing from the spirit and scope of the invention.

What is claimed is:

1. A logic block in a product-term based programmable device comprising:
    a first logic gate configured to generate a first output in response to a logical combination of a first number of product terms;
    a second logic gate configured to generate a second output in response to a logical combination of a second number of product terms;
    a macrocell configured to generate a third output in response to said second output; and
    a multiplexer configured to generate a fourth output in response to (i) said first output or (ii) said third output, wherein said first number of product terms is a subset of said second number of product terms.

2. The logic block according to claim 1, further comprising:
    a first set of product term inputs coupled to said first logic gate;
    a second set of product term inputs coupled to said second logic gate;
    a clock input coupled to said macrocell; and
    a user-configurable memory location input coupled to said multiplexer.

3. The logic block according to claim 1, wherein said first logic gate comprises an OR gate.

4. The logic block according to claim 1, wherein said second logic gate comprises an OR gate.

5. The logic block according to claim 3, wherein said second logic gate comprises an OR gate.

6. The logic block according to claim 2, wherein said macrocell comprises:
    a register configured to generate a register output in response to (i) said second output and (ii) said clock input; and
    a second multiplexer configured to generate said third output in response to (i) said second output, (ii) said register output, and (iii) said user-configurable memory location input.

7. The logic block according to claim 6, wherein said fourth output is coupled to an input/output cell and said third output is a feedback to an interconnect structure of said programmable device.

8. A logic block in a product-term based programmable device comprising:

means for generating a first output in response to a logical combination of a first number of product terms;

means for generating a second output in response to a logical combination of a second number of product terms; and means for selecting an output of the device in response to (i) said first output or (ii) said second output, wherein said first number of product terms is a subset of said second number of product terms.

9. A method of providing a dual-function path in a logic block of a programmable device, said method comprising the steps of:

(A) logically combining a first set of product terms;

(B) logically combining a second set of product terms to provide an output;

(C) coupling the output of the second logical combination to a macrocell;

(D) routing the output of said macrocell to an interconnect structure of said programmable device; and (E) selecting one of the first logical combination or the output of said macrocell as an output for said programmable device, wherein said first set of product terms is a subset of said second set of product terms.

10. The method according to claim 9, wherein said programmable device is a programmable logic device.

11. The method according to claim 9, wherein said selecting step is conducted in accordance with a state stored in a configurable memory location on said programmable device.

* * * * *